(12) United States Patent
Feichtinger et al.

(10) Patent No.: US 11,658,274 B2
(45) Date of Patent: May 23, 2023

(54) COMPONENT

(71) Applicant: TDK Electronics AG, Munich (DE)

(72) Inventors: Thomas Feichtinger, Graz (AT); Stefan Sax, Graz (AT)

(73) Assignee: TDK ELECTRONICS AG, Munich (DE)

( * ) Notice: Subject to any disclaimer, the term of this patent is extended or adjusted under 35 U.S.C. 154(b) by 81 days.

(21) Appl. No.: 17/252,203

(22) PCT Filed: Jun. 24, 2019

(86) PCT No.: PCT/EP2019/066680
§ 371 (c)(1),
(2) Date: Dec. 14, 2020

(87) PCT Pub. No.: WO2020/002244
PCT Pub. Date: Jan. 2, 2020

(65) Prior Publication Data
US 2021/0217939 A1 Jul. 15, 2021

(30) Foreign Application Priority Data
Jun. 26, 2018 (DE) .................... 10 2018 115 342.2

(51) Int. Cl.
*H01L 33/60* (2010.01)
*H01L 25/075* (2006.01)

(52) U.S. Cl.
CPC .......... *H01L 33/60* (2013.01); *H01L 25/0753* (2013.01); *H01L 2933/0058* (2013.01); *H01L 2933/0083* (2013.01)

(58) Field of Classification Search
CPC ............. H01L 2933/0083; H01L 33/58; H01L 2933/0058; H01L 25/0753
See application file for complete search history.

(56) References Cited

U.S. PATENT DOCUMENTS

| | | | |
|---|---|---|---|
| 9,664,847 B2 | 5/2017 | Krenn et al. | |
| 9,671,490 B2 | 6/2017 | Brandl et al. | |
| 2006/0001030 A1* | 1/2006 | Okuwaki | H01L 25/0753 257/431 |
| 2007/0176187 A1* | 8/2007 | Iwanaga | G03B 21/208 257/E33.059 |
| 2007/0268694 A1* | 11/2007 | Bailey | H01L 33/54 257/E33.073 |
| 2008/0151547 A1 | 6/2008 | Grotsch et al. | |
| 2009/0012907 A1 | 1/2009 | Lawrence | |

(Continued)

FOREIGN PATENT DOCUMENTS

| | | |
|---|---|---|
| DE | 102015106367 A1 | 10/2016 |
| DE | 102016200157 A1 | 7/2017 |

(Continued)

OTHER PUBLICATIONS

B. Springer, et al., "Improvement of Beam Performance by Integrating Micro-Optics Onto Wafer-Level-Packaged LEDs," LED Light Sources, ISAL 2017 Proceedings, 2017, 6 pages.

*Primary Examiner* — Feifei Yeung Lopez
(74) *Attorney, Agent, or Firm* — Slater Matsil, LLP (57) ABSTRACT

A component is disclosed. In an embodiment the component includes a light-emitting element and a structured layer having an optical functionality, wherein the structured layer is arranged on the light-emitting element.

21 Claims, 4 Drawing Sheets

(56) References Cited

U.S. PATENT DOCUMENTS

| | | | |
|---|---|---|---|
| 2010/0006877 A1* | 1/2010 | Chen | G02B 19/0028 |
| | | | 257/98 |
| 2016/0064694 A1 | 3/2016 | Choi et al. | |
| 2017/0059838 A1* | 3/2017 | Tilleman | G02B 19/0057 |
| 2017/0184275 A1 | 6/2017 | Aruga | |
| 2019/0203904 A1* | 7/2019 | Lee | H01L 33/44 |

FOREIGN PATENT DOCUMENTS

| | | |
|---|---|---|
| DE | 102016101810 A1 | 8/2017 |
| DE | 102016111330 A1 | 12/2017 |
| EP | 1533633 A1 | 5/2005 |
| EP | 3001099 A1 | 3/2016 |
| JP | 2014127311 A | 7/2014 |
| WO | 2014048832 A1 | 4/2014 |

\* cited by examiner

COMPONENT

This patent application is a national phase filing under section 371 of PCT/EP2019/066680, filed Jun. 24, 2019, which claims the priority of German patent application 102018115342.2, filed Jun. 26, 2018, each of which is incorporated herein by reference in its entirety.

TECHNICAL FIELD

The present invention relates to a component comprising a light-emitting element. The component can be, for example, an LED matrix or an LED array having an integrated carrier comprising both a carrier substrate and the light-emitting elements.

SUMMARY

Embodiments provide adaptation of the emission characteristic of the light-emitting elements. Depending on the envisaged application, focusing of the emitted light may be desired, for example. Further embodiments provide a primary optical system with minimized space requirements in order to enable miniaturization of the component.

A component is proposed which comprises a light-emitting element and a structured layer having an optical functionality, said structured layer being arranged on the light-emitting element.

The structured layer, on account of its optical functionality, in particular, is configured to alter the emission characteristic of the light-emitting element. By means of a suitable choice of the structured layer, the emission characteristic can be adapted to the respective application. By way of example, parallel focused emission of the light in a forward direction is desired in the case of headlights in a vehicle. By contrast, a diffuse emission characteristic is preferred in other applications, for example in the application of the component as flash in a Smartphone.

The structured layer can contribute, in particular, to a large proportion of the light emitted by the light-emitting element being emitted in a desired manner. As a result, the structured layer can contribute to an improvement in the luminous efficiency.

The structured layer can be a thin film. The structured layer can accordingly contribute to a miniaturization of the component and an optical system connected to the light-emitting element.

The light-emitting element can be a light-emitting diode, in particular. Alternatively, the light-emitting element can also be an arrangement of a plurality of light-emitting areas. Each of these areas can comprise one light-emitting diode or a plurality of light-emitting diodes. By way of example, the light-emitting element can be a matrix or an array of light-emitting diodes.

The light-emitting element can emit light in a blue frequency spectrum, for example.

The structured layer can be configured, in particular, to the effect that it collimates, diverges and/or expands light emitted by the light-emitting element. The optical functionalities can thus be collimation, diverging or expanding. The structured layer can have one or else a plurality of these optical functionalities.

In the case of components comprising a plurality of light-emitting elements, so-called optical crosstalk can occur. In this case, a superimposition of the radiation emitted by the light-emitting elements arises on account of a spatial radiation behavior that is typical of light-emitting elements. The result is a superimposition of the respective image points of adjacent light-emitting elements and thus, under certain circumstances, limitations in the resolution and contrast of the component. This undesired optical crosstalk can be avoided by means of focusing of the emitted light. The optical functionality of the structured layer can be chosen in particular in such a way that such optical crosstalk does not occur. To that end, the structured layer can be configured in such a way that it collimates light.

The respective optical functionality of the structured layer is chosen depending on the envisaged application of the component.

The structured layer can comprise a first region having a first optical functionality and a second region having a second optical functionality, wherein the second optical functionality differs from the first optical functionality. Accordingly, the structured layer can enable a plurality of optical functionalities simultaneously.

The first optical functionality can be collimation, diverging and/or expanding. The second optical functionality can likewise be collimation, diverging and/or expanding. Each of the first and second optical functionalities can thus comprise one or a plurality of these functionalities.

The first region can be arranged directly above the light-emitting element and the second region can be arranged laterally with respect to the light-emitting element and not cover the light-emitting element. Accordingly, the structured layer can realize a different functionality above the light-emitting element compared with in regions in which the structured layer does not cover the light-emitting element. By way of example, the light can be collimated in the first region and diverged in the second region. As a result, particularly good focusing of the emitted light can be achieved, wherein the proportion of scattered light can be kept particularly low as a result of the diverging in the second region.

Alternatively, both the first region and the second region of the structured layer can be arranged above the light-emitting element. This can make it possible to form locally different optical functionalities on the light-emitting element. A structured layer embodied in this way can be advantageous in particular if the light-emitting element comprises a plurality of light sources. In this case, the light sources can be regarded as individual pixels and a desired optical functionality can be allocated to each pixel as a result of the different structuring in the individual regions of the structured layer.

The structured layer can form a Fresnel lens. A Fresnel lens has a very small volume and can accordingly contribute to a miniaturization of the component.

The structured layer can comprise a plurality of partial layers, which differ from one another in their physical properties and/or their chemical properties and/or their functional properties. By way of example, one of the partial layers can be an adhesive-promoting carrier layer. A further partial layer can have the structuring of the structured layer.

A structuring of the structured layer can be arranged on a top side of the structured layer facing away from the light-emitting element and/or on an underside of the structured layer facing the light-emitting element. In this case, both the top side and the underside can be either completely or only partially structured.

The structured layer can envelope the light-emitting element. Accordingly, the structured layer can be arranged on all of the outer surfaces of the light-emitting element. Such an arrangement of the structured layer can be expedient in particular in applications in which a diffuse emission characteristic is desired.

A layer thickness of the structured layer can be between 1 μm and 1000 μm. A layer thickness of less than 1 μm does not appear to be expedient since otherwise it is virtually impossible to carry out a structuring of the layer. The layer thickness should not be greater than 1000 μm in order to enable a miniaturization of the component. Since the thin structured layer performs at least part of the functionality of a primary optical system, either a further primary optical system can be completely dispensed with or the further primary optical system can be at least reduced in size. The structured layer can thus contribute to miniaturization.

A light conversion layer can be arranged between the structured layer and the light-emitting element. The light conversion layer can be configured to alter the spectrum of light that passes through it. By way of example, the light conversion layer can convert blue light into white light. The light conversion layer can comprise phosphor. In some exemplary embodiments, the light conversion layer can be embodied as a partial layer of the structured layer. By way of example, the light conversion layer can be formed by an adhesive-promoting partial layer of the structured layer, which comprises for example a substrate film with integrated phosphor.

At least one optical component can be arranged on a top side of the structured layer facing away from the light-emitting element. The optical component can be a collimator. The structured layer can be configured to further support the functionality of the optical components. By way of example, the structured layer could have a pre-collimator function that interacts with the collimator.

The component can comprise a carrier substrate, on which the light-emitting element is arranged, wherein at least one further light-emitting element is arranged on the carrier substrate. In this case, the light-emitting elements can be arranged to form a matrix or an array. An intermediate layer can be arranged between the light-emitting element and the further light-emitting element.

The intermediate layer can perform various functions. It can contribute to securing the structured layer and serve as an alignment device. Alternatively or additionally, it can act as a waveguide and can be configured to pass on light emitted laterally by the light-emitting elements. Alternatively or additionally, the intermediate layer can be configured to absorb light coupled into it. The intermediate layer can thus be configured, inter alia, to absorb, to reflect, to scatter or to convert light coupled from the light-emitting elements into the intermediate layer.

The intermediate layer can be covered by the structured layer. Furthermore, on a top side of the structured layer facing away from the intermediate layer, an additional light conversion layer can be arranged above the intermediate layer.

A top side of the intermediate layer facing away from the carrier substrate can have a depression shaped in such a way that light coupled from the light-emitting elements into the intermediate layer is reflected in the direction of the carrier substrate.

A partition wall can be arranged between the light-emitting element the further light-emitting element. In this case, the partition wall can consist of the same material as the carrier substrate. The partition wall can prevent light of adjacent light-emitting elements being superimposed. Accordingly, the partition wall can avoid or reduce undesired optical crosstalk.

The partition wall can form an angle of between 10° and 80° with a surface of the carrier substrate. The partition wall can be arranged obliquely on the surface of the carrier substrate. The partition wall can have in cross section the shape of a triangle, in particular a triangle having a truncated vertex. The oblique partition wall enables light that is emitted laterally by the light-emitting elements to be reflected in a direction away from the carrier substrate. The light can be focused as a result.

The partition wall can be covered with a reflective layer. The reflective layer can be a metallization. The reflective layer can increase the proportion of the light reflected by the partition wall.

The intermediate layer can comprise an optically transparent filler.

The light-emitting element can be an arrangement of a plurality of light-emitting areas.

The structured layer can cover the arrangement of a plurality of light-emitting areas, wherein the structured layer comprises a first region having a first optical functionality and a second region having a second optical functionality, wherein the second optical functionality differs from the first optical functionality, wherein the first region covers a first area from the arrangement of the plurality of light-emitting areas and the second region covers a second area from the arrangement of the plurality of light-emitting areas. Accordingly, a locally different optical functionality of the individual areas can be formed by the structured layer. In this case, each area can act as pixels that produce a mutually different optical impression for an observer.

As a result of the different structuring of the first region and the second region of the structured layer, the light-emitting areas can be optically decoupled from one another. It is thus possible to prevent the areas from mutually interfering with one another in terms of their emission characteristic.

At least two of the areas from the arrangement of the plurality of light-emitting areas can differ from one another in terms of their size. Light-emitting areas of different sizes are customary for example in headlights used in the automotive field. The component could thus be suitable for use in such a headlight.

BRIEF DESCRIPTION OF THE DRAWINGS

The present invention is described in greater detail below with reference to the figures.

DETAILED DESCRIPTION OF ILLUSTRATIVE EMBODIMENTS

Figure 1:
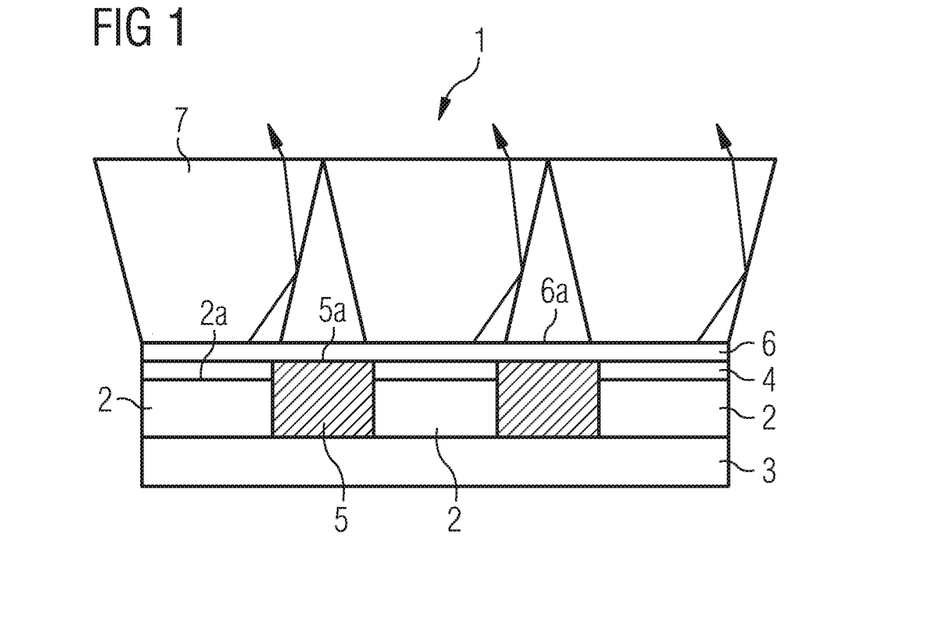
FIG. 1 shows a side view of a component comprising a plurality of light-emitting elements.

FIG. 1 shows a side view of a component 1 comprising a plurality of light-emitting elements 2. The component 1 is a light system. In this case, the plurality of light-emitting elements 2 are arranged to form a matrix or an array. The light system can be used for example in a headlight of a vehicle or in a flash of a portable device, for example of a cellular phone.

The component 1 comprises a carrier substrate 3. The light-emitting elements 2 are arranged on the carrier substrate 3. The carrier substrate 3 has a multilayer construction. The carrier substrate 3 is configured in such a way that the light-emitting elements 2 can be driven separately from one another.

The light-emitting elements 2 can be light-emitting diodes, for example, which emit light having a blue color spectrum. A light conversion layer 4 is arranged on a top side 2a of the light-emitting elements 2 facing away from the carrier substrate 3. The light conversion layer 4 is configured to convert the light emitted by the light-emitting elements 2 in such a way that the spectrum of the emitted radiation changes. By way of example, the light conversion layer 4 can comprise phosphor. In this case, the light conversion layer 4 is configured to convert a blue spectrum emitted by the blue light-emitting diode into a white light spectrum.

A respective interspace is arranged between two adjacent light-emitting elements 2 on the carrier substrate 3. Said interspace is filled with an intermediate layer 5. The intermediate layer 5 can for example comprise silicone or consist of silicone. In the exemplary embodiment shown here, the intermediate layer 5 is configured to absorb light coupled from the light-emitting elements 2 into the intermediate layer 5. A lateral emission of light is prevented in this way. In addition to the silicone, the intermediate layer 5 can comprise a filler material, as a result of which the absorptivity of the intermediate layer 5 is increased. The intermediate layer 5 avoids an optical coupling of the light-emitting elements 2 that are adjacent to one another.

Such an optical coupling is also referred to as crosstalk. The crosstalk between the adjacent light-emitting elements 2 is avoided by means of the intermediate layer 5.

Alternatively or additionally, the intermediate layer 5 can be configured as a waveguide. Accordingly, the intermediate layer 5 can be configured to pass on light coupled into the intermediate layer 5 in a desired manner. By way of example, the intermediate layer 5 can guide the light coupled into it toward the carrier substrate 3.

Furthermore, the material of the intermediate layer 5 is chosen in such a way that the coefficient of thermal expansion of the intermediate layer 5 does not deviate significantly from the coefficient of thermal expansion of the light-emitting elements 2 in order to prevent mechanical stresses from arising in the event of temperature changes. For setting the coefficient of thermal expansion, fillers can be admixed with the material of the intermediate layer 5.

Furthermore, the component 1 comprises a structured layer 6 having an optical functionality. The structured layer 6 is arranged on a top side 4a of the light conversion layer 4 facing away from the carrier substrate 3 and on a top side 5a of the intermediate layer 5 facing away from the carrier substrate 3. The structured layer 6 covers the light-emitting element 2 and an interspace between two adjacent light-emitting elements 2. The structured layer 6 is structured in such a way that it can alter the emission characteristic of the light emitted by the light-emitting element 2. In the exemplary embodiment shown in FIG. 1, the structured layer 6 collimates the emitted light. Accordingly, it has the function of an optical pre-collimator. In particular, the structured layer 6 is structured in such a way that it forms a Fresnel lens.

The structured layer 6 is a film. It has a thickness of less than 1000 μm. On account of its thin design, no additional mechanical components are needed for fixing it. Rather, the intermediate layer 5 arranged in the interspace between two adjacent light-emitting elements 2 contributes to securing and aligning the structured layer 6. The intermediate layer 5 can accordingly also be referred to as an alignment device.

The component 1 comprises a plurality of optical components 7. The optical components 7 are collimators. The optical components 7 are arranged on a top side 6a of the structured layer 6 facing away from the carrier substrate 3 and the light-emitting element 2. In this case, a collimator is arranged on the top side 2a of each light-emitting element 2. The collimator likewise contributes to collimating light emitted by the light-emitting element 2. In this case, the structured layer 6 arranged on the light-emitting element 2 supports the function of the optical component 7. As a result of the interaction of the structured layer 6 and the optical component 7, a very good collimation of the emitted light can be achieved in the exemplary embodiment shown in FIG. 1.

In an alternative exemplary embodiment, the structured layer 6 can also have a different optical functionality. By way of example, the structured layer 6 could also be configured to diverge or to expand light emitted by the light-emitting element 2.

Figure 2:
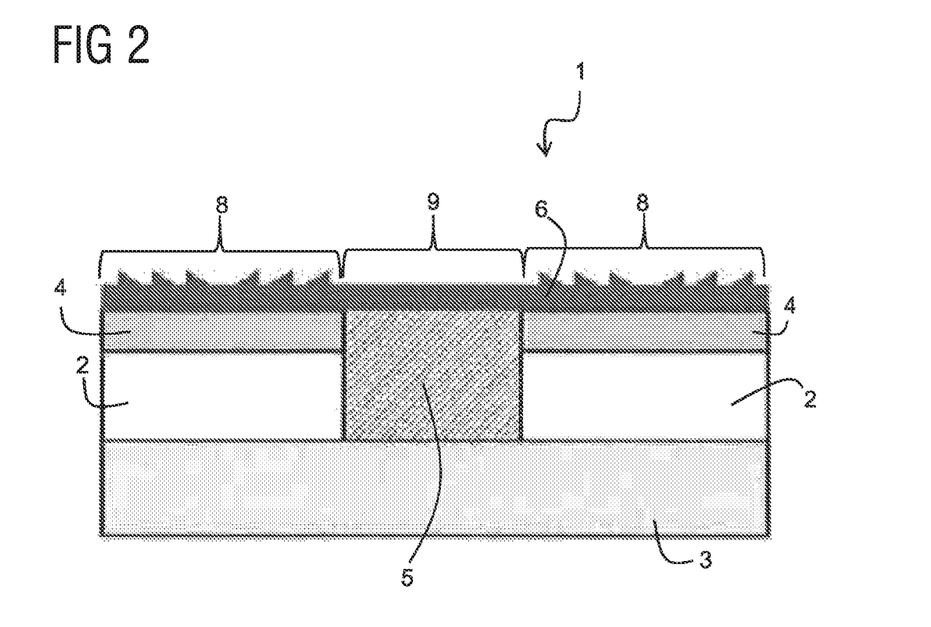
FIG. 2 shows a second exemplary embodiment of the component.

FIG. 2 shows a second exemplary embodiment of the component 1.

In the second exemplary embodiment, the structured layer 6 differs from the structured layer 6 shown above in that it comprises a first region 8, in which the structured layer 6 is structured in such a way that it has a first optical functionality, and a second region 9, in which the structured layer 6 is structured in such a way that it has a second optical functionality, which differs from the first functionality. The first region 8 here is in each case that region of the structured layer 6 which covers a light-emitting element 2. The second region 9 here is that region of the structured layer 6 which covers the interspaces between two adjacent light-emitting elements 2. The second region 9 is thus not arranged directly above a light-emitting element 2.

The structured layer 6 can comprise a plurality of first regions 8 having the first optical functionality and a plurality of second regions 9 having the second optical functionality.

In the first region 8 the structured layer 6 is structured in such a way that it collimates light emitted by the light-emitting element 2. In particular, the structured layer 6 can be structured to form a Fresnel lens in the first region 8. In FIG. 2, the structuring in the first region 8 is illustrated with exaggerated size for the sake of better illustration. In the second region 9 the structured layer 6 is structured in such a way that it diverges light emitted by the light-emitting element 2. As a result, diffuse light is generated in the second region 9. In the second region 9 the structured layer 6 can be irregularly structured or roughened, for example.

Light that is emitted by the light-emitting elements 2 in a perpendicular direction, i.e. away from the carrier substrate 3, reaches the first region 8 of the structured layer 6. This light is accordingly collimated. Light that is coupled from the light-emitting elements 2 laterally into the intermediate layer 5 passes for the most part into the second region 9 of the structured layer 6 and is accordingly diverged. An emission characteristic of the component 1 which has only very little scattered light is produced as a result of the collimation of the perpendicularly emitted light and the diverging of the laterally emitted light.

The component 1 in accordance with the second exemplary embodiment can furthermore comprise an optical component 7, which, as shown in the first exemplary embodiment, is arranged on the top side 6a of the structured layer 6. In the case of the exemplary embodiment shown in FIG. 2, however, such an optical component 7 is not provided.

Figure 3:
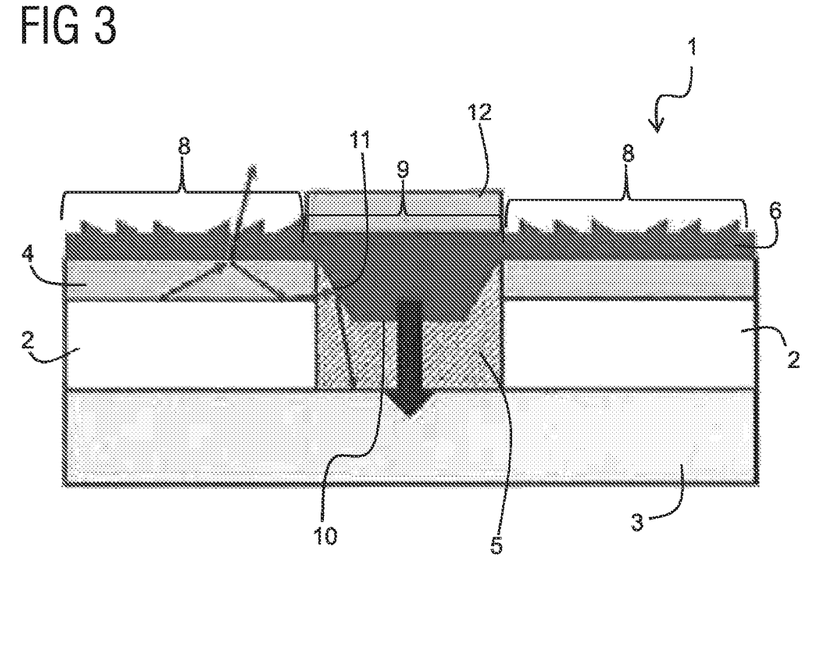
FIG. 3 shows a third exemplary embodiment of the component.

FIG. 3 shows a third exemplary embodiment of the component 1. The third exemplary embodiment differs from the second exemplary embodiment with regard to the configuration of the intermediate layer 5. In accordance with the first and second exemplary embodiments, the intermediate layer 5, at its top side 5a facing away from the carrier substrate 3, terminates flush with the light conversion layer 4 and is configured in a flat fashion. In accordance with the third exemplary embodiment, by contrast, the intermediate layer 5 has a depression 10 at its top side 5a. As a result of the depression 10, an oblique interface 11 is formed between the intermediate layer 5 and the structured layer 6.

At the oblique interface 11, light emitted laterally by the light-emitting element 2 or by the light conversion layer 4 is reflected in the direction of the carrier substrate 3. In this case, a material of the carrier substrate 3 can be chosen in such a way that it has a high absorptance and absorbs the emitted light in this way. This configuration of the intermediate layer 5 contributes to minimizing the proportion of scattered light in the emission characteristic.

Furthermore, in accordance with the third exemplary embodiment, an additional light conversion layer 12 is provided, which covers parts of the top side 6a of the structured layer 6. In particular, the additional light conversion layer 12 here covers the second region 9 of the structured layer 6. The additional light conversion layer 12 is configured to alter a spectrum of light coupled into it. In particular, the additional light conversion layer 12 is provided to convert light that is coupled laterally from the light-emitting elements 2 into the intermediate layer 5 and that is then emitted at the top side 6a of the structured layer 5, without having passed through the light conversion layers 4. The additional light conversion layer 12 can likewise comprise phosphor. It thus serves to convert a remaining portion of the blue light spectrum into white light.

The additional light conversion layer 12 shown in the third exemplary embodiment can also be provided in the first and second exemplary embodiments. In further alternative exemplary embodiments, it is conceivable for light-emitting elements 2 to be partly or completely enveloped by the light conversion layer 4. In the case of partial enveloping, the light conversion layer 4 could be arranged on all of the outer sides of the light-emitting element 2, apart from an underside of the light-emitting element 2 bearing directly on the carrier substrate 3. In the case where the light-emitting element 2 is completely enveloped by the light conversion layer 4, the underside of the light-emitting element 2 is additionally also covered by the light conversion layer 4.

Figure 4:
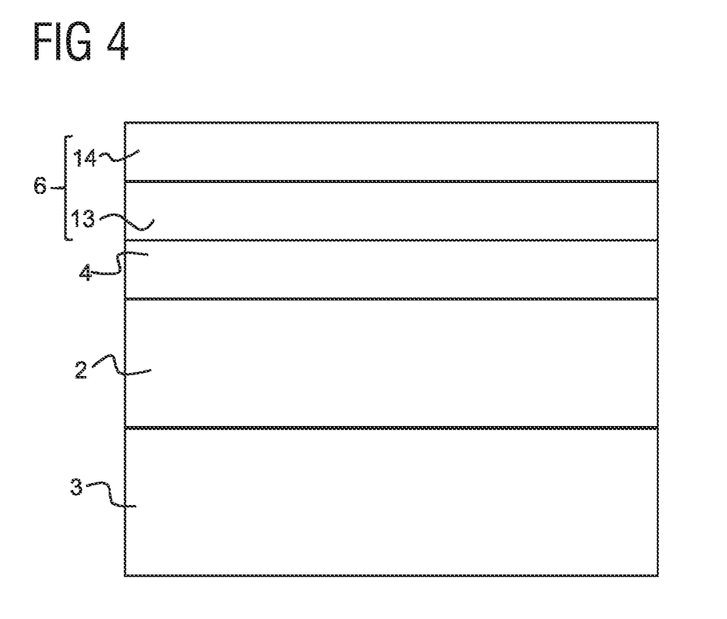
FIG. 4 shows a detailed view of part of the component.

FIG. 4 shows a detailed view of part of the component 1.

The carrier substrate 3 is a multilayer ceramic substrate. The light-emitting element 2 is a light-emitting diode configured to emit light in a blue light spectrum. The light conversion layer 4 comprising phosphor is arranged directly on the light-emitting diode. The structured layer 6 is arranged on a top side 4a of the light conversion layer 4 facing away from the light-emitting element 2.

The structured layer 6 comprises a lower partial layer 13 and an upper partial layer 14. The lower partial layer 13 bears directly on the light conversion layer 4. The lower partial layer 13 is an adhesion-promoting carrier layer. It can for example comprise one or more of the materials selected from polycarbonate (PC), polymethyl methacrylate (PMMA) and polyethylene terephthalate (PET) or consist of one of these materials.

The upper partial layer 14 is arranged on the side of the lower partial layer 13 facing away from the light-emitting element 2. The structuring of the structured layer 6 is effected in the upper partial layer 14. The structuring can be produced by embossing, by a thermal printing method or by laser treatment of the upper partial layer 14.

Figure 5:
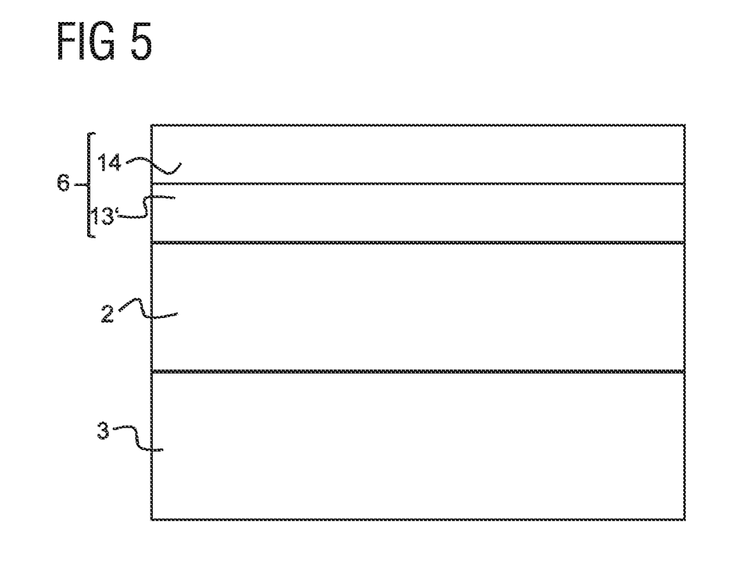
FIG. 5 shows a further exemplary embodiment of the component.

FIG. 5 shows a further exemplary embodiment of the component 1. In the exemplary embodiment shown in FIG. 5, the light conversion layer 4 and the lower partial layer 13 of the structured layer 6 have been combined to form a single layer 13'. This is a layer which comprises a material having an adhesive-promoting carrier function for the upper partial layer of the structured layer, for example PC, PMMA or PET, and which furthermore comprises a material that contributes to the light conversion, for example phosphor. A substrate film with integrated phosphor is thus involved.

Figure 6:
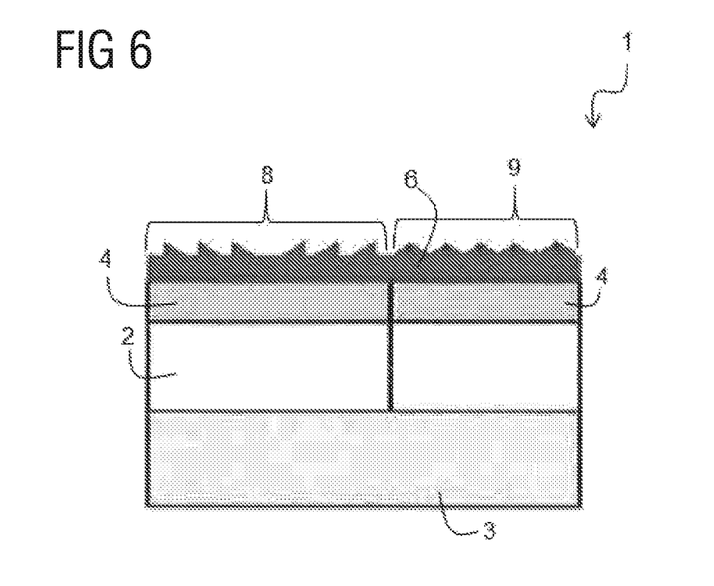
FIG. 6 shows a further exemplary embodiment of the component.

FIG. 6 shows a further exemplary embodiment of the component 1. The component 1 comprises a light-emitting element 2 consisting of a plurality of light-emitting areas. Two of these areas are shown by way of example in FIG. 6. The structured layer 6 covers the areas of the light-emitting element 2. The structured layer 6 comprises a first region 8 having a first optical functionality and a second region 9 having a second optical functionality. The optical functionalities of the first region 8 and of the second region 9 differ from one another. The first region 8 is arranged above a first area of the light-emitting element 2 and the second region 9 is arranged above a second area of the light-emitting element 2. In this case, the two areas act as pixels and exhibit a different emission characteristic on account of the different structuring of the layer 6.

The two areas are of different sizes. In an alternative exemplary embodiment, the areas can be of identical size. The component can comprise more than two areas, which can differ from one another in terms of their area.

Each of the areas shown can comprise a single light-emitting diode or an array consisting of a plurality of light-emitting diodes as light source.

Figure 7:
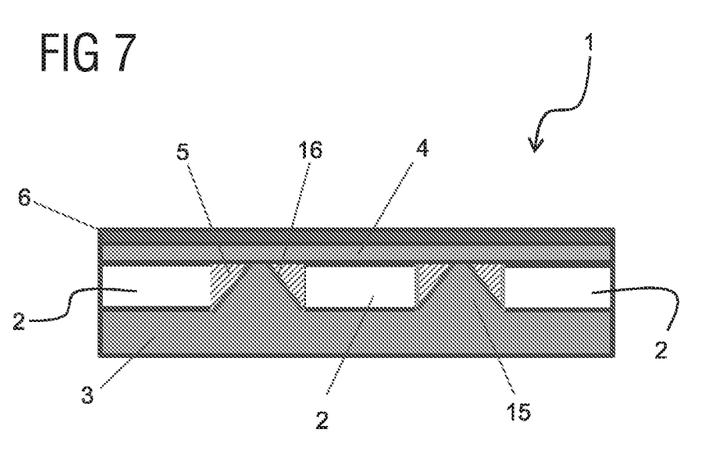
FIG. 7 shows a further exemplary embodiment of the component.

FIG. 7 shows a further exemplary embodiment of the component 1. The component 1 comprises a plurality of light-emitting elements 2 arranged on a carrier substrate 3. The carrier substrate 3 is a multilayer substrate configured to drive each of the light-emitting elements 2 separately.

A partition wall 15 is arranged between two light-emitting elements 2 that are adjacent to one another. The partition wall 15 can consist of the same material as the carrier substrate 3. The partition wall 15 is arranged obliquely with respect to a surface of the carrier substrate 3. In the exemplary embodiment shown in FIG. 7, the partition wall 15 is arranged at an angle of 45° with respect to the surface of the carrier substrate 3.

The partition wall 15 has the shape of a triangle having a truncated vertex. In this case, the side faces of the triangle are arranged obliquely with respect to the side faces of the light-emitting elements 2. The partition wall 15 extends from the carrier substrate 3 as far as a light conversion layer 4.

A reflective layer 16 is arranged on the partition wall. The reflective layer 16 can be a metal layer, for example.

An interspace between the light-emitting elements 2 and the partition wall 15 is filled with an intermediate layer 5. The intermediate layer 5 consists of an optically transparent filler. The partition wall 15 separates a region between two adjacent light-emitting elements 2 into two separate interspaces, each of which is filled with an intermediate layer 5.

Light that is emitted by one of the light-emitting elements 2 in a lateral direction and is coupled into the intermediate layer 5 impinges on the obliquely arranged partition wall 15 and is reflected by the reflective layer 16. In this case, the partition wall 15 is arranged in such a way that the light is reflected in a direction away from the carrier substrate 3. In this case, the light is also reflected away from the adjacent light-emitting element 2. As a result, the partition wall 15 has the effect that the light emitted by the light-emitting elements 2 is focused. Light of adjacent light-emitting elements 2 is superimposed to a lesser extent and undesired optical crosstalk can be avoided or at least reduced.

The light-emitting elements 2 can be light-emitting diodes that emit light in a blue frequency spectrum. The component 1 comprises a light conversion layer 4, which covers the light-emitting elements 2, the intermediate layer 5 and the partition wall 15. The light conversion layer 4 comprises phosphor and is configured to convert the blue light into white light.

The light conversion layer 4 is covered with a structured layer 6. The structured layer 6 has an optical functionality and can be for example a Fresnel lens having an optical pre-collimator function. The structured layer 6 can also form other optical functions. By way of example, the structured layer 6 can be configured in such a way that it collimates, diverges and/or expands light emitted by the light-emitting elements 2.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A component comprising:
a light-emitting element;
a structured layer having an optical functionality, wherein the structured layer is arranged on the light-emitting element;
a carrier substrate on which the light-emitting element is arranged;
at least one further light-emitting element arranged on the carrier substrate; and
an intermediate layer arranged between the light-emitting element and the further light-emitting element,
wherein a top side of the intermediate layer facing away from the carrier substrate has a depression shaped such that light coupled from the light-emitting elements into the intermediate layer is reflected in a direction of the carrier substrate, and
wherein the intermediate layer does not cover an upper side of the light-emitting element facing to the structured layer and an upper side of the further light-emitting element facing to the structured layer.

2. The component according to claim 1,
wherein the structured layer is configured to collimate, diverge and/or expand light emitted by the light-emitting element, and/or
wherein the structured layer forms a Fresnel lens.

3. The component according to claim 1, wherein the structured layer comprises a first region having a first optical functionality and a second region having a second optical functionality, and wherein the second optical functionality differs from the first optical functionality.

4. The component according to claim 3,
wherein the first optical functionality is collimation, diverging and/or expanding, and
wherein the second optical functionality is collimation, diverging and/or expanding.

5. The component according to claim 3,
wherein the first region is arranged directly above the light-emitting element, and
wherein the second region is arranged laterally with respect to the light-emitting element and does not cover the light-emitting element.

6. The component according to claim 1, wherein the structured layer comprises a plurality of partial layers differing from one another in their physical properties and/or their chemical properties and/or their functional properties.

7. The component according to claim 1, wherein the structured layer envelopes the light-emitting element.

8. The component according to claim 1, wherein a layer thickness of the structured layer is between 1 µm and 1000 µm, inclusive.

9. The component according to claim 1, further comprising a light conversion layer arranged between the structured layer and the light-emitting element.

10. The component according to claim 1, further comprising at least one optical component arranged on a top side of the structured layer facing away from the light-emitting element.

11. The component according to claim 1, wherein the intermediate layer is configured to absorb, reflect, scatter or convert light from the light-emitting elements into the intermediate layer.

12. The component according to claim 1,
wherein the intermediate layer is covered by the structured layer, and
wherein, on a top side of the structured layer facing away from the intermediate layer, an additional light conversion layer is arranged above the intermediate layer.

13. The component according to claim 1, further comprising a partition wall arranged between the light-emitting element and the further light-emitting element.

14. The component according to claim 13, wherein the partition wall forms an angle of between 10° and 80°, inclusive, with a surface of the carrier substrate.

15. The component according to claim 13, wherein the partition wall is covered with a reflective layer.

16. The component according to claim 1, wherein the intermediate layer comprises an optically transparent filler.

17. The component according to claim 1, wherein the light-emitting element is an arrangement of a plurality of light-emitting areas.

18. The component according to claim 17,
wherein the structured layer covers the arrangement of the plurality of light-emitting areas,
wherein the structured layer comprises a first region having a first optical functionality and a second region having a second optical functionality,
wherein the second optical functionality differs from the first optical functionality, and
wherein the first region covers a first area from the arrangement of the plurality of light-emitting areas and the second region covers a second area from the arrangement of the plurality of light-emitting areas.

19. The component according to claim 17, wherein at least two of the areas from the arrangement of the plurality of light-emitting areas differ from one another in terms of their size.

20. The component according to claim 3, wherein the first region and the second region are arranged directly above the light-emitting element.

21. The component according to claim 1, wherein the structured layer is a Fresnel lens.

* * * * *